United States Patent
Skones et al.

(10) Patent No.: US 6,778,116 B1
(45) Date of Patent: Aug. 17, 2004

(54) SWITCHING DAC PULSE ENCODING CIRCUIT

(75) Inventors: William M. Skones, Manhattan Beach, CA (US); Steve R. Nelson, Hermosa Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/374,250

(22) Filed: Feb. 25, 2003

(51) Int. Cl.$^7$ ................................................ H03M 1/66
(52) U.S. Cl. ....................................................... 341/144
(58) Field of Search ........................................ 341/144

(56) References Cited

U.S. PATENT DOCUMENTS 4,663,610 A * 5/1987 Metz et al. ................. 341/144
6,061,010 A 5/2000 Adams et al.

* cited by examiner

Primary Examiner—Howard L. Williams
(74) Attorney, Agent, or Firm—John A. Miller; Warn, Hoffmann, Miller & LaLone, P.C.

(57) ABSTRACT

A DAC including a first switch and a second switch. The first switch receives a digital signal to be converted, and the second switch receives the digital signal delayed by one-half of a clock signal. A third switch receives a current signal from a current source and the clock signal. The third switch alternately switches the current signal to the first and second switches so that when the clock signal is positive, the current signal is applied to the first switch and when the clock signal is zero, the current signal is applied to the second switch. The first switch will output the current signal during the first half of the clock cycle to a first output or a second output, and the second switch will output the current signal during the second half of the clock cycle to the first output or the second output.

20 Claims, 2 Drawing Sheets

SWITCHING DAC PULSE ENCODING CIRCUIT

BACKGROUND OF THE INVENTION

1. Field of the Invention

This invention relates generally to a digital-to-analog converter (DAC) and, more particularly, to a DAC that switches current from a current source to two separate switches during a single data clock cycle to reduce or eliminate transient non-linearity.

2. Discussion of the Related Art

Cellular telephone base stations employ RF transceivers for processing cellular telephone signals. The transceiver processing circuitry typically employs digital signal processing to demodulate and decode the receive signal, and encode and modulate the transmit signal. Because the transmit and receive signals are analog signals, the transceiver circuitry employs analog-to-digital converters (ADC) and digital-to-analog converters (DAC) to convert the signals from the analog domain to the digital domain and the digital domain to the analog domain to provide for digital signal processing. In some designs, an ADC may include one or more DACs as part of the conversion circuit.

In this application, it is typically necessary to provide extremely high accuracy and high resolution digital conversion, for example, on the order of twelve to sixteen bits. One data conversion scheme that requires high accuracy and high resolution is a delta sigma ADC or DAC. A delta sigma DAC is a circuit that employs over-sampling and quantization noise shaping to provide high resolution and high accuracy for a low resolution quantizer.

In some applications, such as in a delta sigma ADC and at the output of a transmitter, a DAC that exhibits excellent static and transient linearity is required. Transient non-linearity results from differences in the switching characteristics of the DAC depending on the incoming sequence of digital bits. For example, in a one bit DAC, the transition of the output voltage signal of the DAC representing a zero bit to the output voltage signal of the DAC representing a one bit (rise time) is different than the transition of the output voltage signal from a one bit to a zero bit (fall time). This data dependence is a source of transient non-linearity. A DAC with poor transient linearity will produce distortions significantly affecting its performance. This distortion typically manifests itself as inter-symbol interference (ISI) where the DAC output waveform for a particular clock period is a function of not only the sequence of digital bits applied to the DAC for that clock period, but also for the digital signal applied for a preceding clock period.

U.S. Pat. No. 6,061,010, titled Dual Return-to-Zero Pulse Encoding in a DAC Output Stage, issued May 9, 2000 to Adams et al., discloses a DAC that attempts to correct waveform distortions by employing a return-to-zero (RTZ) technique that masks DAC switching transitions and causes each bit time to contain both a rising edge and a falling edge. The '010 RTZ circuit operates by outputting an analog signal representing the digital input signal during the first half of a signal clock period, and outputting zero, or some reference level, during the second half of the clock period. The digital input signal changes states when the RTZ circuit is outputting a zero, so transient nonlinearity is masked.

FIG. 1 is a schematic block diagram of a DAC 10 showing the RTZ technique of the '010 patent. The digital data stream is applied to a first RTZ circuit 12 and a delay device 14. The delay device 14 delays the data stream by one-half of a system clock signal, and applies the delayed digital data stream to a second RTZ circuit 16. Therefore, the RTZ circuit 16 receives the same digital data stream as the RTZ circuit 12, only delayed by one half of a clock period. A current signal from current sources 18 and 20 are also applied to the RTZ circuits 12 and 16, respectively. The system clock signal is applied to the RTZ circuit 12 and an inverted system clock signal is applied to the RTZ circuit 16. The analog current outputs of the RTZ circuits 12 and 16 are applied to a current summer 22 that sums the analog signals together to provide the desired analog output value over the complete clock period. Thus, for the positive part of the clock signal, the RTZ circuit 12 outputs the representative zero bit or one bit voltage level for that bit, and during the zero part of the clock signal, the RTZ circuit 16 outputs the same current level for that data bit.

FIG. 6 of the '010 patent shows a more detailed schematic diagram of the block diagram shown in FIG. 1 above. As is apparent from a review of this figure, each of the two RTZ circuits includes a separate current source. The RTZ circuits include a differential pair of field effect transistors (FETs), where one of the FETs conducts for a one bit and the other FET conducts for a zero bit. Another FET in each RTZ circuit is caused to conduct for the part of the clock period where the other RTZ circuit is operational to direct the current signal away from the output. Particularly, the current source for the RTZ circuit that is not providing the output is coupled to a "throw-away point" when the other RTZ circuit is providing the output. The summed outputs from the RTZ circuits 12 and 16 are provided as differential outputs $I_{out+}$ and $I_{out-}$.

The DAC disclosed in the '010 patent is effective in reducing transient non-linearity caused by transitions in the different voltage or current output levels of the DAC. However, because one of the current sources in the DAC is throwing its current signal away, this approach is inefficient. This results in a significant limitation in a DAC that must supply significant output power, such as in transmitters. Ideally, timing jitter during the switching between the output from the RTZ circuit 12 to the output from the RTZ circuit 16 does not induce an error because their outputs are the same. However, the timing jitter of the individual RTZ circuit 12 or 16 does contribute because it may cause both RTZ circuits 12 and 16 to be on or off at the same time. Further, the use of two current sources adds to system hardware and complexity.

BRIEF SUMMARY OF THE INVENTION

In accordance with the teachings of the present invention, a digital-to-analog converter (DAC) is disclosed that provides reduced transient non-linearity and system inefficiency than those DACs known in the art. The DAC is responsive to a digital signal having a sequence of data bits that is split into a first path and a second path. The first path is coupled to a first switch and the second path is coupled to a delay device. The delay device delays the digital signal by one-half of a system clock cycle, and then applies the delayed digital signal to a second switch. A third switch is responsive to the system clock and switches current from a current source alternately between the first and second switches so that when the clock signal is positive, the current signal is applied to the first switch, and when the clock signal is negative, the current signal is applied to the second switch. Depending on whether the digital signal is high or low (one bit or a zero bit), or some value in between, the first and second switches will switch the current signal to a positive output summer or a negative output summer. If the digital signal is transmitting a one bit, the first switch will output the current signal to the positive output summer during the first half of the clock signal period and the second switch will output the current signal to the positive summer during the second half of the clock signal period. Likewise, if the digital signal is transmitting a zero bit, the first switch will output the current signal to the negative summer during the first half of the clock signal period and the second switch will output the current signal to the negative summer during the second half of the clock signal period. Thus, the output of the DAC is a positive signal or a negative signal for the entire clock period.

Additional advantages and features of the present invention will become apparent from the following description and appended claims, taken in conjunction with the accompanying drawings.

DETAILED DESCRIPTION OF THE INVENTION

The following discussion of the embodiments of the invention directed to a digital-to-analog converter is merely exemplary in nature, and is in no way intended to limit the invention or its applications or uses.

Figure 1:
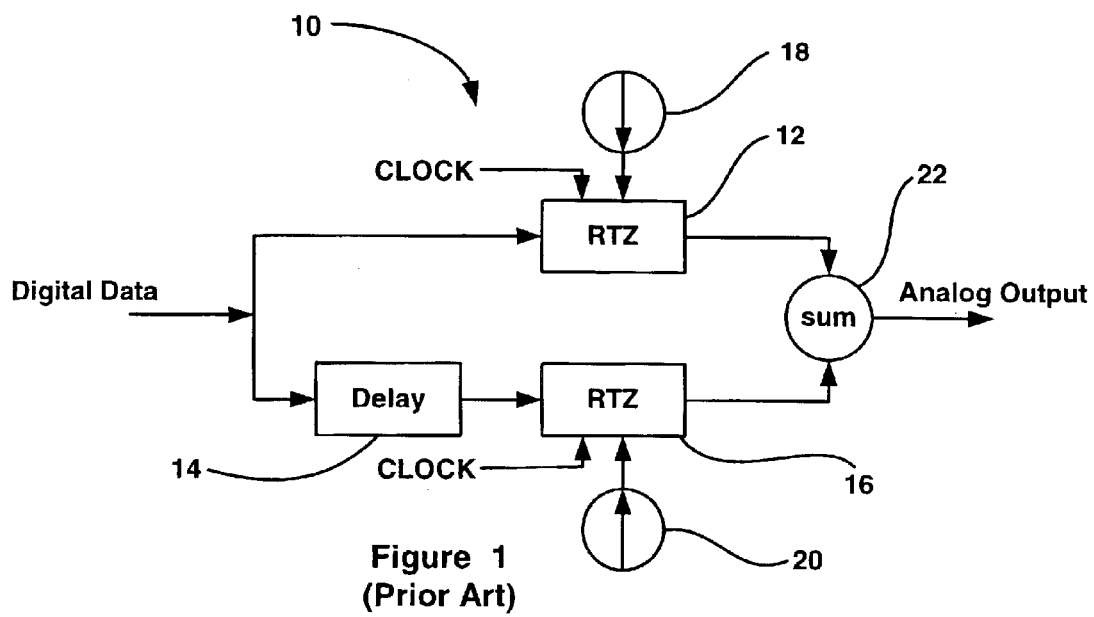
FIG. 1 is a schematic block diagram of a known return-to-zero digital-to-analog converter.
Figure 2:
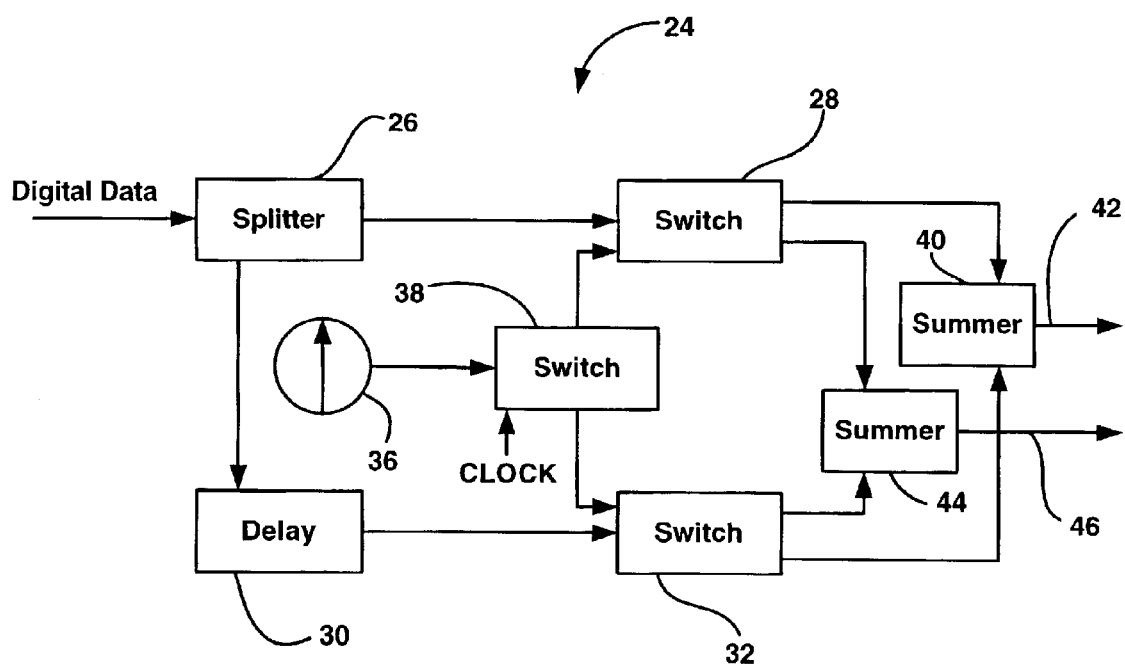
FIG. 2 is a schematic block diagram of a digital-to-analog converter, according to an embodiment of the present invention.

FIG. 2 is a schematic block diagram of a DAC 24, according to an embodiment of the present invention. The DAC 24 has similarities to the DAC 10 discussed above, but does not employ RTZ circuits and multiple current sources. The digital data signal including the stream of digital data bits to be converted is applied to a digital splitter 26 that splits the digital signal into two paths. The split digital signal is applied to a first switch 28 on one path and a digital delay device 30 on the other path. The delay device 30 delays the digital signal by one half of the period of the system clock. The delay device 30 can be any digital delay device suitable for the purposes described herein, such as a latch circuit. The delayed digital signal from the delay device 30 is applied to a second switch 32.

A current source 36 generates a current signal of a suitable level. The current signal from the current source 36 and a system clock signal are applied to a third switch 38. The switch 38 alternately switches the current signal to the switch 28 for the positive pulses of the clock signal, and switches the current signal to the switch 32 when the clock signal is negative. Therefore, the current signal is applied to the switch 28 during the first half of the clock cycle, and the current signal is applied to the switch 32 during the second half of the clock signal, or vice versa.

When the digital signal is transmitting a one bit and the clock signal is positive, the switch 28 outputs the current signal to a positive summer 40. When the digital signal is transmitting the one bit and the clock signal is negative, the switch 32 outputs the current signal to the positive summer 40. Therefore, the DAC 24 outputs the current signal on a positive output line 42 over the complete clock period for a one bit. When the digital signal is transmitting a zero bit and the clock signal is positive, the switch 28 outputs the current signal to a negative summer 44. When the current signal is transmitting the zero bit and the clock signal is negative, the switch 32 outputs the current signal to the negative summer 44. Therefore, the DAC 24 outputs the current signal on a negative output line 46 over the complete clock cycle for a zero bit.

The switches 28, 32 and 38 can employ any switching devices suitable for the purposes described herein, For example, the switching devices 28, 32 and 38 can employ bipolar transistors, such as heterojunction bipolar transistors (HBTs) or field effect transistors.

Figure 3:
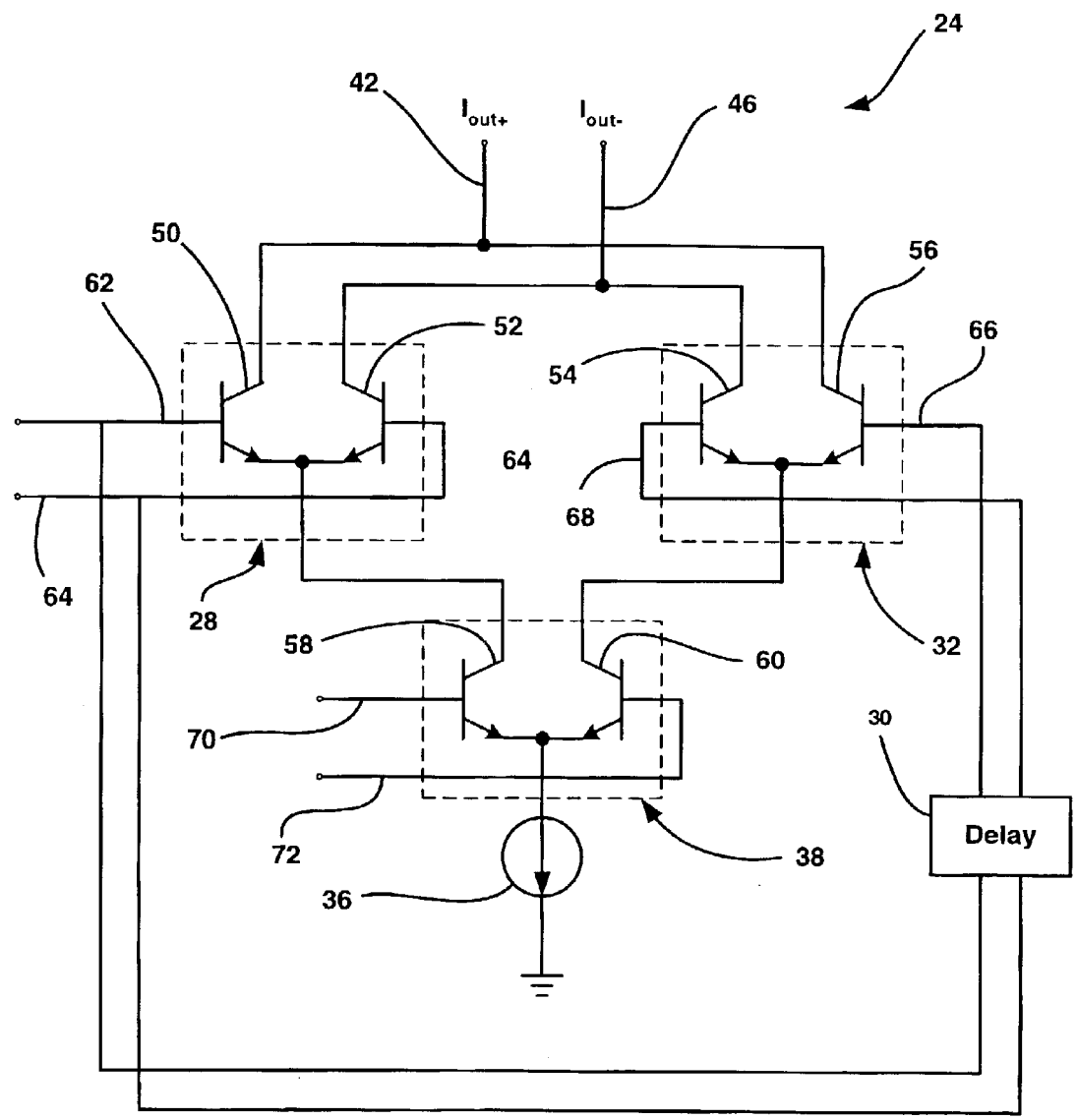
FIG. 3 is a schematic diagram of the digital-to-analog converter shown in FIG. 2.

FIG. 3 is a schematic diagram of the DAC 24, according to one embodiment of the invention, where the switches 28, 32 and 38 employ bipolar transistors, and where like elements are identified by the same reference numerals. Particularly, the switch 28 includes a differential transistor pair having NPN bipolar transistors 50 and 52, the switch 32 includes a differential transistor pair having NPN bipolar transistors 54 and 56, and the switch 38 includes a differential transistor pair having NPN bipolar transistors 58 and 60.

When a one bit is being transmitted, the positive part of the differential digital signal is applied to the base terminal of the transistor 50 on line 62, and the negative part of the digital signal is applied to the base terminal of the transistor 52 on line 64. Simultaneously, the digital signal is applied to the delay device 30. After a time delay of one-half of one system clock cycle, the positive part of the digital signal is applied to the base terminal of the transistor 56 on line 66, and the negative part of the digital signal is applied to the base terminal of the transistor 54 on line 68.

When a zero bit is being transmitted, the positive part of the differential digital signal is applied to the base terminal of the transistor 52 on the line 64, and the negative part of the digital signal is applied to the base terminal of the transistor 50 on the line 62. Simultaneously, the digital signal is applied to the delay device 30. After a time delay of one-half of one system clock cycle, the positive part of the digital signal is applied to the base terminal of the transistor 54 on line 68, and the negative part of the digital signal is applied to the base terminal of the transistor 56 on the line 66.

In the first half of the data output cycle, the positive part of the system clock is applied to the base terminal of the transistor 58 on line 70, and the negative part of the clock is applied to the base terminal of the transistor 60 on line 72. In the second half of the data output cycle, the positive part of the system clock is applied to the base terminal of the transistor 60 on the line 72, and the negative part of the system clock is applied to the base terminal of the transistor 58 on the line 70.

The collector terminal of the transistor 58 is coupled to the emitter terminals of the transistors 50 and 52, and the collector terminal of the transistor 60 is coupled to the emitter terminals of the transistors 54 and 56. The emitter terminals of the transistors 58 and 60 are coupled to the current source 36. The collector terminals of the transistors 50 and 56 are coupled to the positive output line 42, and the collector terminals of the transistors 52 and 54 are coupled to the negative output line 46.

When the digital data signal is inputting a one bit, the transistor 50 conducts during the first half of the clock cycle, and the transistor 56 conducts during the second half of the clock cycle. During the first half of the clock cycle, the transistor 58 conducts so that current $I_{out+}$ flows into the DAC 24 on the line 42 through the transistors 50 and 58 and the current source 36 to ground. During the second half of the clock cycle, the transistor 60 conducts so that the current $I_{out+}$ flows into the DAC 24 through the transistors 56 and 60 and the current source 36 to ground.

When the digital data signal is inputting a zero bit, the transistor 52 conducts during the first half of the clock cycle, and the transistor 54 conducts during the second half of the clock cycle. During the first half of the clock cycle, the transistor 58 conducts so that current $I_{out-}$ flows into the DAC 24 on the line 46 through the transistors 52 and 58 and the current source 36 to ground. During the second half of the clock cycle, the transistor 60 conducts so that the current $I_{out-}$ flows into the DAC 24 through the transistors 54 and 60 and the current source 36 to ground. Therefore, for a digital one bit, current is provided on the output line 42, and for a digital zero bit, current is provided on the output line 46.

The DAC 24 is shown employing NPN bipolar transistors in FIG. 3. However, in an alternate design, the DAC 24 can employ PNP bipolar transistors that would provide current flow in the opposite direction. Additionally, MOSFETs, NESFETs, HEMTs, or any other method of switching current can also be employed in the switches 28, 32 and 38. In a DAC with more than one input bit and including multiple current switches, each current switch would be implemented as a DAC 24.

The foregoing discussion discloses and describes merely exemplary embodiments of the present invention. One skilled in the art will readily recognized from such discussion and from the accompanying drawings and claims, that various changes, modifications and variations can be made thyerein without departing from the spirit and scope of the invention as defined in the following claims.

What is claimed is:

1. A digital-to-analog converter (DAC) for converting a digital signal to a representative analog signal, said converter comprising:
    a first switch responsive to the digital signal;
    a delay device responsive to the digital signal, said delay device delaying the digital signal a predetermined period of time;
    a second switch responsive to the delayed digital signal from the delay device;
    a single current source for generating a current signal; and
    a third switch responsive to the current signal from the current source and a clock signal, said clock signal having clock cycles defined by a positive portion and a negative portion, wherein the third switch directs the current signal from the current source to the first switch during the positive portions of the clock cycle and directs the current signal from the current source to the second switch during the negative portions of the clock cycle, and wherein the first switch directs the current signal to a first output of the DAC when the digital signal is transmitting a one bit, the second switch directs the current signal to the first output of the DAC when the digital signal is transmitting the one bit, the first switch directs the current signal to a second output of the DAC when the digital signal is transmitting a zero bit, and the second switch directs the current signal to the second output of the DAC when the digital signal is transmitting the zero bit.

2. The converter according to claim 1 wherein the delay device delays the digital signal by one-half of the clock cycle.

3. The converter according to claim 1 wherein the first, second and third switches include transistors.

4. The converter according to claim 3 wherein the first, second and third switches include a differential pair of transistors.

5. The converter according to claim 3 wherein the transistors are bipolar transistors.

6. The converter according to claim 1 wherein the digital signal is a differential digital signal.

7. The converter according to claim 1 wherein the signal on the first output is a positive current signal and the signal on the second output is a negative current signal.

8. A digital-to-analog converter (DAC) for converting a differential digital signal to a representative analog signal, said differential digital data signal including a positive part and a negative part, said converter comprising:
    a first switch responsive to the digital signal, said first switch including a differential transistor pair having a first transistor and a second transistor;
    a delay device responsive to the digital signal, said delay device delaying the digital signal one-half of a period of a predetermined clock signal;
    a second switch responsive to t he delayed digital signal from the delay device, said second switch including a second differential pair of transistors having a third transistor and a fourth transistor;
    a single current source for generating a current signal; and
    a third switch responsive to the current signal from the current source and the clock signal, said third switch including a third differential transistor pair having a fifth transistor and a sixth transistor, said clock signal having clock cycles defined by a positive portion and a negative portion, wherein the third switch directs the current signal from the current source to the first switch during the positive portions of the clock cycle and directs the current signal from the current source to the second switch during the negative portions of the clock cycle, and wherein the first switch directs the current signal to a first output of the DAC during the positive portions of the clock cycle when the digital signal is transmitting a one bit, the second switch directs the current signal to the first output of the DAC for the negative portions of the clock signal when the digital signal is transmitting the one bit, the first switch directs the current signal to a second output of the DAC for the positive portions of the clock cycle when the digital signal is transmitting a zero bit, and the second switch directs the current signal to the second output of the DAC for the negative portions of the clock signal when the digital signal is transmitting the zero bit.

9. The converter according to claim 8 wherein the positive part of the digital signal is applied to the first transistor, the negative part of the digital signal is applied to the second transistor, the positive part of the delayed digital signal is applied to the third transistor, and the negative part of the delayed digital signal is applied to the fourth transistor when a one bit is being transmitted, and wherein the positive part of the digital signal is applied to the second transistor, the negative part of the digital signal is applied to the first transistor, the positive part of the delayed digital signal is applied to the fourth transistor, and the negative part of the delayed digital signal is applied to the third transistor when a zero bit is being transmitted.

10. The converter according to claim 8 wherein the transistors are bipolar transistors.

11. The converter according to claim 10 wherein an emitter terminal of the first and second transistors are electrically coupled to a collector terminal of the fifth transistor, an emitter terminal of the third and fourth transistors are electrically coupled to a collector terminal of the sixth transistor, a collector terminal of the first and third transistors are electrically coupled to the first output, a collector terminal of the second and fourth transistors are electrically coupled to the second output, and an emitter terminal of the fifth and sixth transistors are electrically coupled to the current source.

12. The converter according to claim 10 wherein a collector terminal of the first and second transistors are electrically coupled to an emitter terminal of the fifth transistor, a collector terminal of the third and fourth transistors are electrically coupled to an emitter terminal of the sixth transistor, an emitter terminal of the first and third transistor are electrically coupled to the first output, an emitter terminal of the second and fourth transistors are electrically coupled to the second output, and a collector terminal of the fifth and sixth transistors are electrically coupled to the current source.

13. A digital-to-analog converter (DAC) for converting a digital signal to an analog signal, said converter comprising a single current source and a plurality of switches, wherein a first switch alternately directs a current signal from the current source to a second switch and a third switch during each clock cycle of a clock signal, and wherein the second switch and the third switch output a first analog signal during each clock cycle when the digital signal is transmitting a one bit, and the second switch and the third switch output a second analog signal during each clock cycle when the digital signal is transmitting a zero bit.

14. The converter according to claim 13 wherein the digital signal applied to the third switch is delayed by one-half of the clock cycle.

15. The converter according to claim 13 wherein the first, second and third switches include bipolar transistors.

16. A method of converting a digital signal to an analog signal, comprising:

applying a digital signal to a first switch;

delaying the digital signal by a predetermined period of time;

applying the delayed digital signal to a second switch;

generating a current signal;

applying the current signal and a clock signal to a third switch, said clock signal having clock cycles defined by a positive portion and a negative portion;

directing the current signal from the current source to the first switch during the positive portions of the clock cycles;

directing the current signal from the current source to the second switch during the negative portions of the clock cycles;

directing the current signal from the first switch to a first output when the digital signal is transmitting a one bit;

directing the current signal from the second switch to the first output when the digital signal is transmitting the one bit;

directing the current signal from the first switch to a second output when the digital signal is transmitting a zero bit; and directing the current signal from the second switch to the second output when the digital signal is transmitting the zero bit.

17. The method according to claim 16 wherein delaying a digital signal includes delaying the digital signal by one-half of the clock cycle.

18. The method according to claim 16 wherein the first, second and third switches include transistors.

19. The converter according to claim 18 wherein the first, second and third switches include a differential pair of transistors.

20. The method according to claim 18 wherein the transistors are bipolar transistors.

* * * * *